United States Patent [19]

Morizuka

[11] Patent Number: 4,679,305

[45] Date of Patent: Jul. 14, 1987

[54] METHOD OF MANUFACTURING A HETEROJUNCTION BIPOLAR TRANSISTOR HAVING SELF-ALIGNED EMITTER AND BASE AND SELECTIVE ISOLATION REGIONS

[75] Inventor: Kouhei Morizuka, Yokohama, Japan

[73] Assignee: Kabushiki Kaisha Toshiba, Kawasaki, Japan

[21] Appl. No.: 810,300

[22] Filed: Dec. 18, 1985

[30] Foreign Application Priority Data

Dec. 21, 1984 [JP] Japan ............................ 59-268383

[51] Int. Cl.[4] ..................................... H01L 21/265
[52] U.S. Cl. .................................. 29/576.3; 29/571;
148/1.5; 148/175; 148/187; 148/DIG. 10;
148/DIG. 84; 357/16; 357/34
[58] Field of Search ............... 29/576 B, 571; 148/1.5,
148/175, 187; 357/16, 34

[56] References Cited

U.S. PATENT DOCUMENTS

| | | | |
|---|---|---|---|
| 4,347,654 | 9/1982 | Allen et al. | 29/576 B |
| 4,356,623 | 11/1982 | Hunter | 29/571 |
| 4,380,774 | 4/1983 | Yoder | 357/34 |
| 4,593,457 | 6/1986 | Birritella | 29/576 B |
| 4,617,724 | 10/1986 | Yokoyama et al. | 29/576 B |

FOREIGN PATENT DOCUMENTS

| | | |
|---|---|---|
| 0062170 | 10/1982 | European Pat. Off. . |
| 0127725 | 12/1984 | European Pat. Off. . |
| 3512814 | 12/1985 | Fed. Rep. of Germany ... 148/DIG. 10 |

OTHER PUBLICATIONS

Electronics Letters, vol. 15, No. 1, 4th Jan. 1979, pp. 13-15, IEE, Hitchin, Herts., GB; J. R. Grierson, et al: "High Power 11 GHz GaAs Hi-Lo Impatt Diodes with Titanium Schotty Barriers", * FIG. 1; p. 13, paragraph: Diode Fabrication.
IEEE Electron Device Letters, vol. EDL-4, No. 4, Apr. 1983, pp. 81-84, IEEE, New York, US; P. M. Asbeck, et al.: "Application of thermal pulse annealing to ion-implanted GaAlAs/GaAs Heterojunction bipolar transistors".
W. P. Dumke, et al; "GaAs-GaAlAs Heterojunction Transistor for High Frequency Operation", Solid-State Electronics, 1972, vol. 15, pp. 1139-1343.
T. Furutuka, et al; "Performance of Sidewall-Assisted Closley-Spaced Electrode GaAs MESFETs", National Converntion Record; 1984, IECE of Japan, Part 2, p. 24.
Miller et al, Electronics Letts., vol. 19(10), May 1983, p. 367.

Primary Examiner—Upendra Roy
Attorney, Agent, or Firm—Oblon, Fisher, Spivak, McClelland & Maier

[57] ABSTRACT

A method of manufacturing a heterojunction bipolar transistor comprising the steps of forming a first semiconductor layer of a first conductivity type as a collector on a semiconductor substrate, forming a second semiconductor layer of a second conductivity type as a base on the first semiconductor layer, forming a third semiconductor layer of the first conductivity type as an emitter on the second semiconductor layer, the third and second semiconductor layers constituting a heterojunction, selectively forming a first mask on the third semiconductor layer, ion-implanting ions of an impurity of the second conductivity type into the resultant structure using a first mask, thereby forming an external base region of the second conductivity type extending to the second semiconductor layer, forming a second mask on a side wall of the first mask, and ion-implanting a predetermined material into the resultant structure using the first and second masks, thereby forming a high-resistance layer for isolating the external base region in self-alignment with the emitter.

11 Claims, 34 Drawing Figures

F I G. 3S
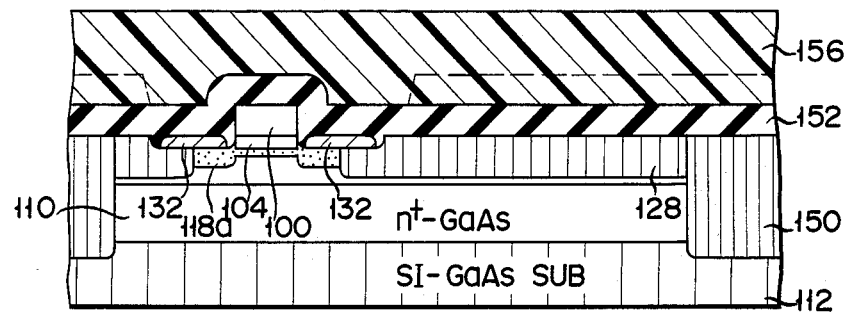
F I G. 3T
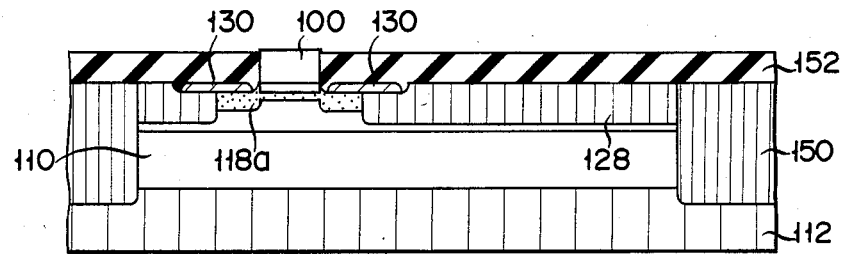
F I G. 3U
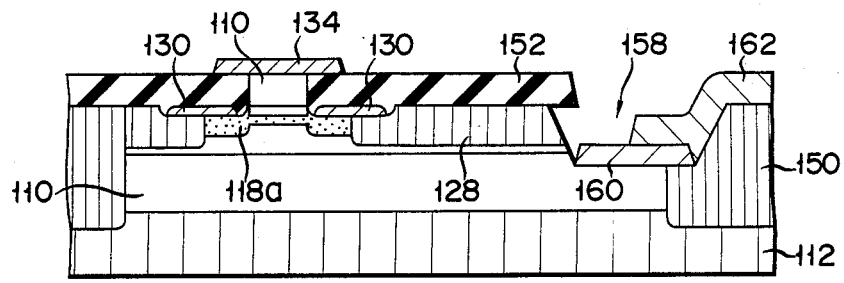

METHOD OF MANUFACTURING A HETEROJUNCTION BIPOLAR TRANSISTOR HAVING SELF-ALIGNED EMITTER AND BASE AND SELECTIVE ISOLATION REGIONS

BACKGROUND OF THE INVENTION

The present invention relates to a method of manufacturing a semiconductor device and, more particularly, to a method of manufacturing a heterojunction bipolar transistor.

Since heterojunction bipolar transistors can have a higher base doping concentration than homojunction bipolar transistors, they are advantageous in technical fields where high-speed operation is required. In order to operate bipolar transistors at a high speed, the various parasitic capacitance levels must be reduced. Reduction of the parasitic capacitance between the base and the collector is particularly effective. In conventional Si transistors, the parasitic capacitance between the base and the collector is reduced by using polycrystalline silicon or self-alignment technology. However, in heterojunction bipolar transistors, almost no attempt has been made to effectively reduce the parasitic capacitance between the base and the collector. This is because the method of manufacturing heterojunction bipolar transistors is quite different from that of conventional Si transistors. Thus, the excellent characteristics of heterojunction bipolar transistors have not been fully utilized to date. A method of manufacturing a conventional heterojunction bipolar transistor will be described with reference to FIGS. 1A to 1C to discuss this problem.

A heterojunction bipolar transistor is normally manufactured using a mixed crystal of a III-V group compound which can form a good heterojunction. FIG. 1A shows an example of a wafer for a heterojunction bipolar transistor grown by MBE (Molecular Beam Epitaxy). The structure has, beginning from the top, n-type AlGaAs layer 10, p-type GaAs layer 12, and n-type GaAs layer 14. N-type AlGaAs layer 10 serves as the emitter; layer 12, the base; and layer 14, the collector. In order to manufacture a heterojunction bipolar transistor from this wafer, a p-type impurity, e.g., Mg ions are ion-implanted to form p-type region 16 for connection with the base electrode, as shown in FIG. 1B. Then, as shown in FIG. 1C, B ions are ion-implanted to form high-resistance layer 18 for base isolation. Base and emitter electrodes 20 and 22 are formed to complete the main part of the transistor. In the transistor manufactured by the conventional method shown in FIG. 1C, the junction capacitance at interface 24 between a p-type region 16a and collector semiconductor 14 accounts for most of the parasitic capacitance between the base and the collector.

In order to produce a high-speed transistor, the area of interface 24 between region 16a and collector 14 must be reduced. However, even if the mask alignment precision for reliably isolating base electrode 20 from the emitter is set to be, e.g., 1 μm, it is difficult to set width W of region 16a at 3 μm or less. In this manner, since mask alignment is used in the conventional method, width W of the external base region cannot be reduced, and the parasitic capacitance between the base and the collector is increased.

SUMMARY OF THE INVENTION

It is a first object of the present invention to provide a method of manufacturing a heterojunction bipolar transistor wherein an external base region is formed in self-alignment with an emitter region, so that the parasitic capacitance between the base and the collector can be significantly reduced as compared with conventional methods.

It is a second object of the present invention to provide a method of manufacturing a heterojunction bipolar transistor wherein a base electrode is formed in self-alignment with the emitter region, so that the base electrode can be correctly positioned with reference to the emitter region.

It is a third object of the present invention to provide a method of manufacturing a heterojunction bipolar transistor having a base electrode with low contact resistance.

In order to achieve the first object of the present invention, a method of manufacturing a heterojunction bipolar transistor, comprises the steps of:
(a1) forming a first semiconductor layer of a first conductivity type as a collector on a semiconductor substrate;
(a2) forming a second semiconductor layer of a second conductivity type as a base on the first semiconductor layer;
(a3) forming a third semiconductor layer of the first conductivity type as an emitter on the second semiconductor layer, the third and second semiconductor layers constituting a heterojunction;
(a4) selectively forming a first mask on the third semiconductor layer;
(a5) ion-implanting ions of an impurity of the second conductivity type into the resultant structure using a first mask, thereby forming an external base region of the second conductivity type extending to the second semiconductor layer;
(a6) forming a second mask on a side wall of the first mask; and
(a7) ion-implanting a predetermined first material into the resultant structure using the first and second masks, thereby forming a high-resistance layer for isolating the external base region in self-alignment with the emitter.

A method of manufacturing a heterojunction bipolar transistor for achieving the second object of the present invention includes, in addition to the above steps, the following steps of:
(a8) etching the side wall of the second mask so as to leave a third mask thinner than the second mask on the side wall of the first mask;
(a9) forming a layer of conductive material on the resultant structure; and
(a10) removing the first and third masks so as to lift-off extra conductive material, thereby forming a base electrode in contact with the external base region in self-alignment with the emitter.

A method of manufacturing a heterojunction bipolar transistor in order to achieve the third object of the present invention includes, in addition to the above steps, the following step of:
before step (a9), selectively forming a fourth mask, and etching part of the external base region so as to expose the second semiconductor layer.

According to the present invention, the external base region is formed in self-alignment with the emitter region. Therefore, the external base region can be formed on the order of submicrons, and so the parasitic capacitance between the base and the collector can be significantly reduced compared to the conventional method. As a result, a heterojunction bipolar transistor manufactured by the method of the present invention can be operated at high speed.

BRIEF DESCRIPTION OF THE DRAWINGS

Other objects nd advantags will be apparent from the following description taken in conjunction with the accompanying drawings in which.

DETAILED DESCRIPTION OF THE PREFERRED EMBODIMENTS

The first embodiment for manufacturing a heterojunction bipolar transistor according to the present invention will be described with reference to FIGS. 2A to 2J.

Figure 1A:
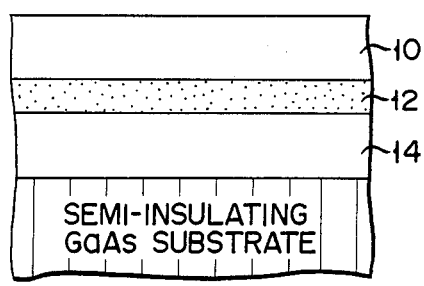
FIGS. 1A to 1C show sectional views of a heterojunction bipolar transistor manufactured by a conventional method.
Figure 1B:
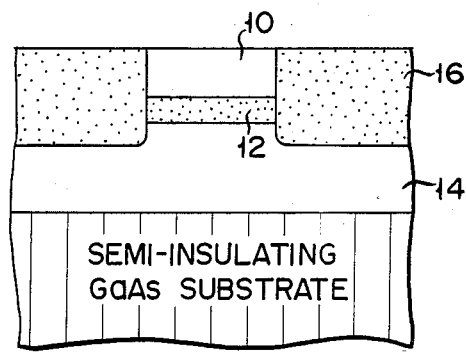
Figure 1C:
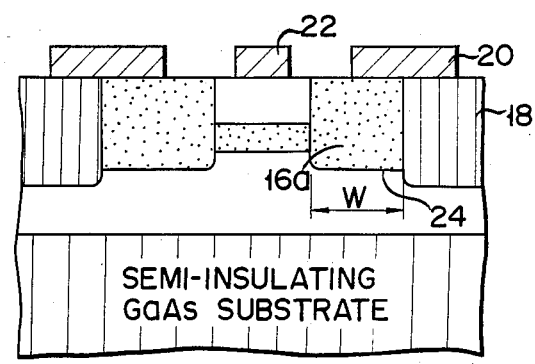
Figure 2A:
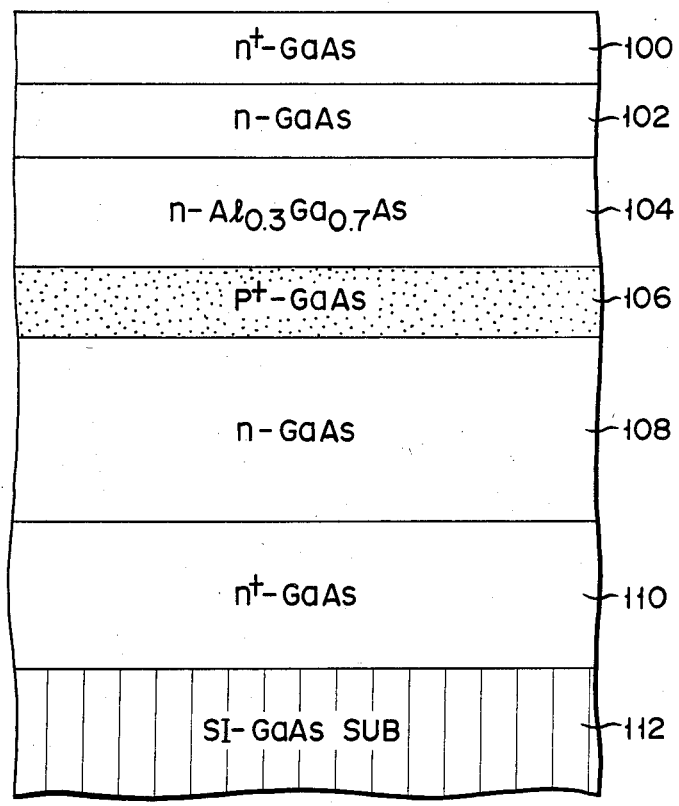
FIGS. 2A to 2J are sectional views of a semifinished product for explaining a method of manufacturing a heterojunction bipolar transistor according to a first embodiment of the present invention.

FIG. 2A shows a wafer structure used in this embodiment. The wafer is obtained by MBE. The wafer, beginning from the top, has $n^{30}$-type GaAs layer 100 (about 0.1 μm thick), n-type GaAs layer 102 (about 0.15 μm thick), n-type $Al_{0.3}Ga_{0.7}As$ layer 104 (about 0.02 μm thick), $p^{+}$-type GaAs layer 106 (about 0.1 μm thick), n-type GaAs layer 108, and $n^{+}$-type GaAs layer 110 (about 0.3 μm thick). Semi-insulating GaAs substrate 112 is used. Layers 100, 102 and 104 serve as the emitter, layer 106 serves as the base, and layers 108 and 110 serve as the collector.

Figure 2B:
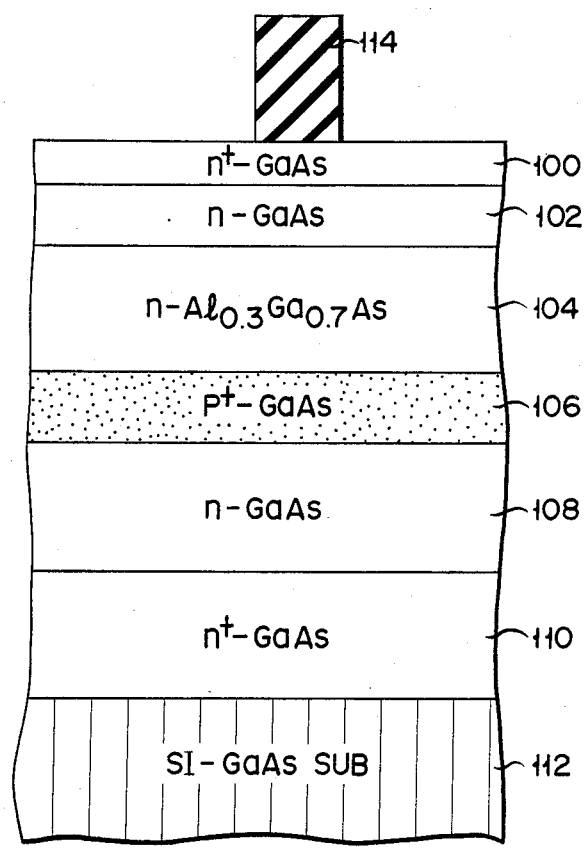

An $SiO_2$ film is grown on the wafer to a thickness of 1.0 μm by CVD. An emitter region pattern is formed using a photoresist. Using the resist pattern as a mask, the $SiO_2$ film is etched by RIE (Reactive Ion Etching) using $CF_4$ gas as an etchant to form $SiO_2$ film 114. When the resist pattern is removed, the structure shown in FIG. 2B is obtained. $SiO_2$ film 114 is thick enough to block ions to be implanted later.

Figure 2C:
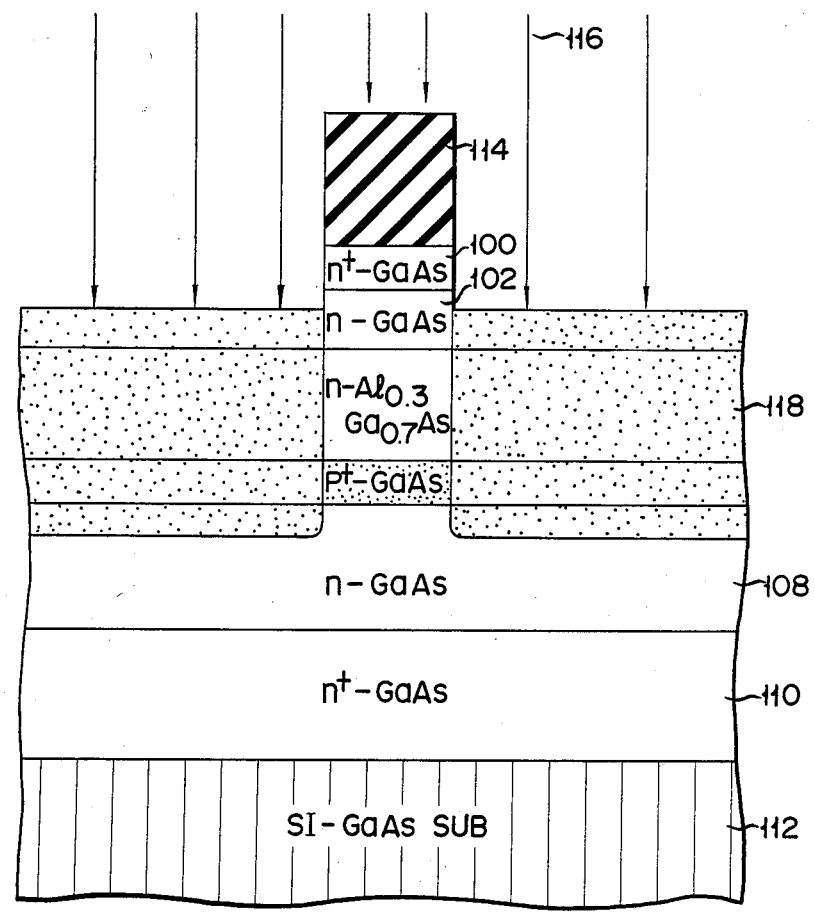

GaAs layers 100 and 102 are etched by 0.15 μm by RIE using chlorine gas ($Cl_2$) and $SiO_2$ film 114 as a mask. Mg ions are then ion-implanted at a dose of $2 \times 10^{14}$ cm$^{-2}$ and an acceleration voltage of 200 keV to a depth of 0.6 μm. The Mg ions reach n-type GaAs layer 108. FIG. 2C shows this step and the resultant structure. Referring to FIG. 2C, arrows indicated by reference numerals 116 illustrate ion-implanted Mg ions. Due to the masking effect of $SiO_2$ film 114, Mg ions are ion-implanted only in the region etched by RIE to form Mg ion-implanted region 118. Region 118 serves as an external base region.

Figure 2D:
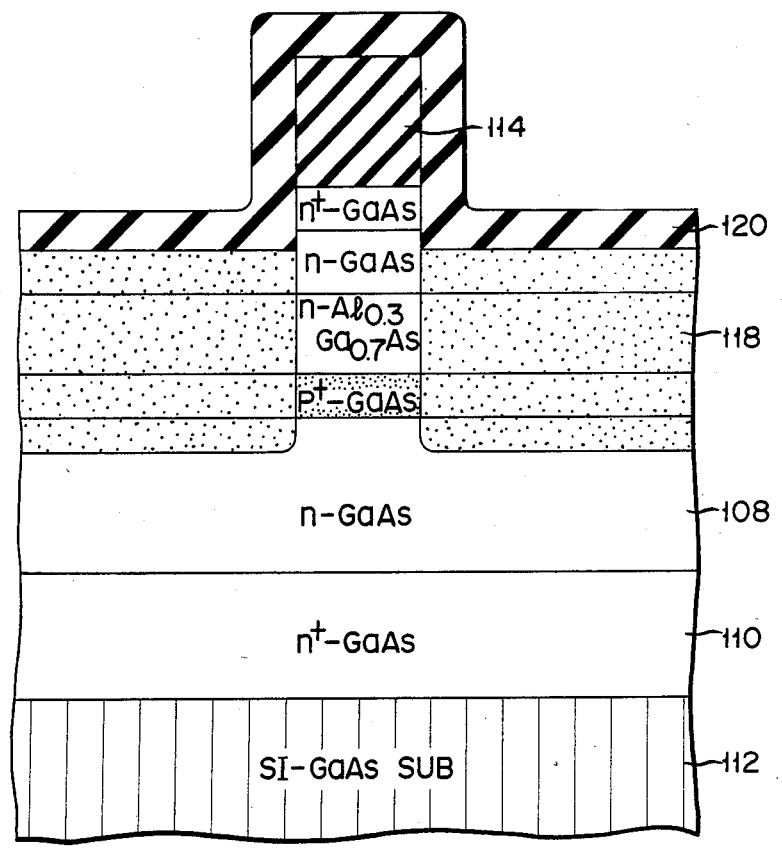

CVD $SiO_2$ film 120 is deposited on the wafer to a thickness of 0.2 μm, as shown in FIG. 2D. Thereafter, annealing is performed at 800° C. using an infrared lamp. Then, ion-implanted Mg ions are activated as acceptors to make, region 118 $p^+$-type conductive.

Figure 2E:
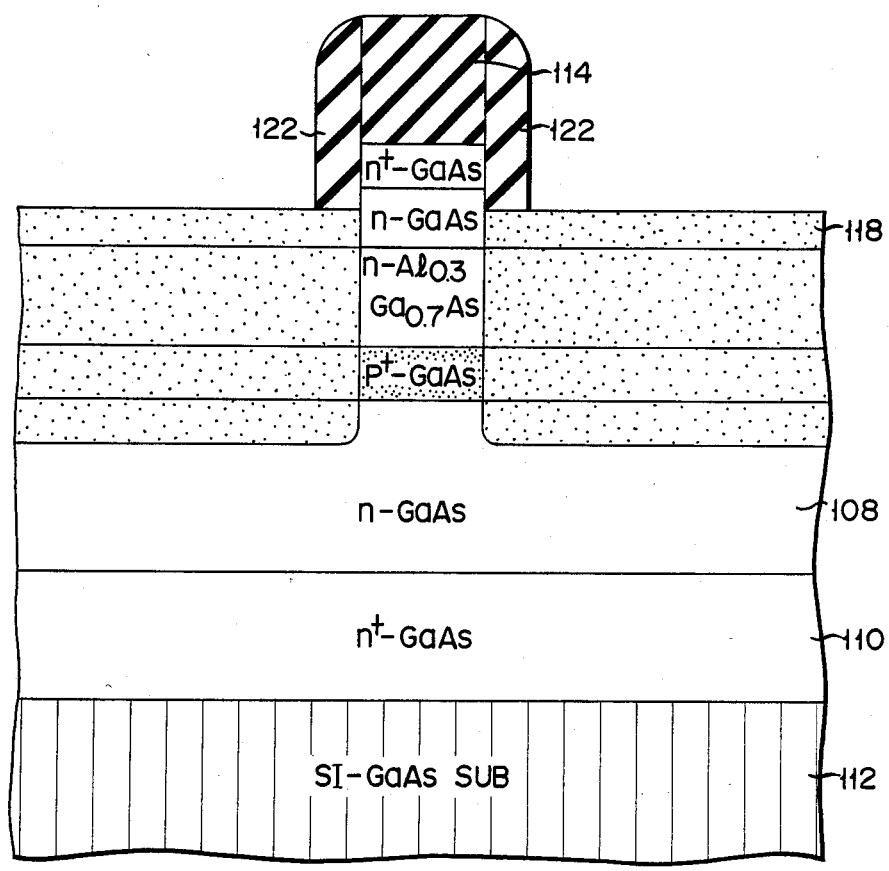

Then, $SiO_2$ film 120 is etched by 0.2 μm by RIE using $CF_4$ gas. Due to RIE anisotropic etching, $SiO_2$ film 120 remains only on the side wall of mask material 114 to provide a structure as shown in FIG. 2E. Reference numeral 122 denotes the $SiO_2$ film remaining on the side wall.

Figure 2F:
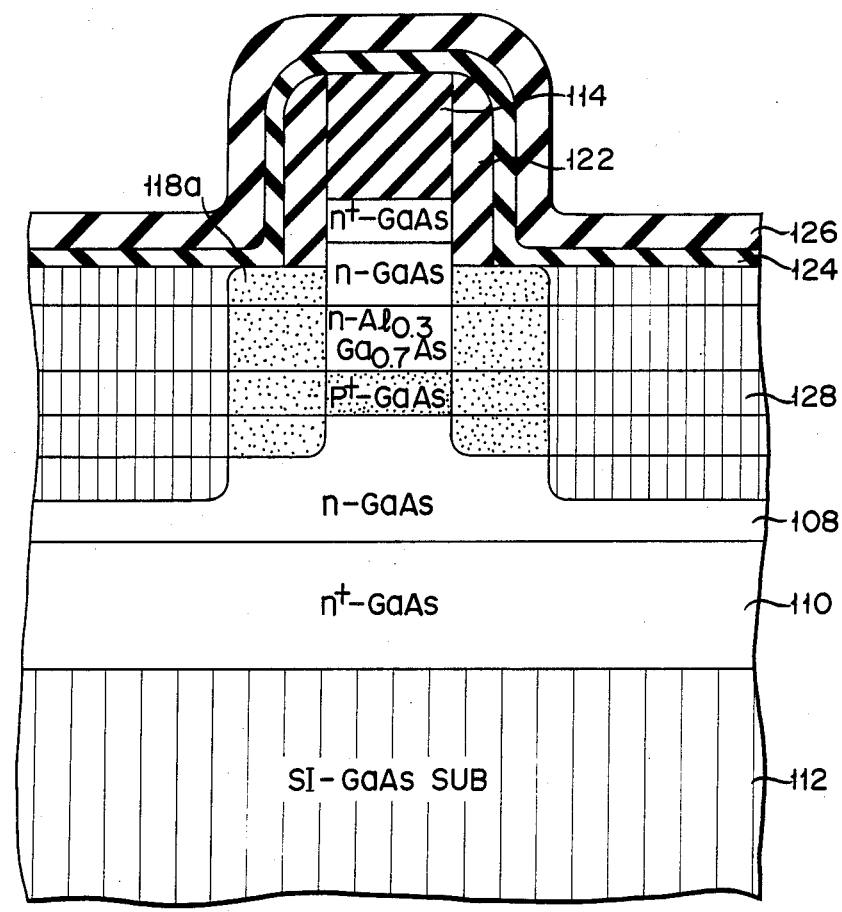

500 Å thick $Si_3N_4$ film 124 is deposited on the wafer by P-CVD (Plasma CVD), and 0.2 μm thick $SiO_2$ film 126 is formed to provide a structure as shown in FIG. 2F. B ions are ion-implanted into the wafer at an acceleration voltage of 150 keV and a dose of $1 \times 10^{13}$ cm$^{-2}$. B ions are ion-implanted only through a thin portion of the wafer, i.e., a portion of $SiO_2$ film 126 and $Si_3N_4$ film 124 having a total thickness of 0.25 μm, thereby reaching the substrate. Thus, high-resistance layer 128 is formed. Mg ion-implanted region not having a high resistance serves as external base region 118a. The total thickness of $SiO_2$ film 126 and $Si_3N_4$ film 124 may be large enough to define the width of external base region 118a. $Si_3N_4$ film 124 need not always be formed.

Figure 2G:
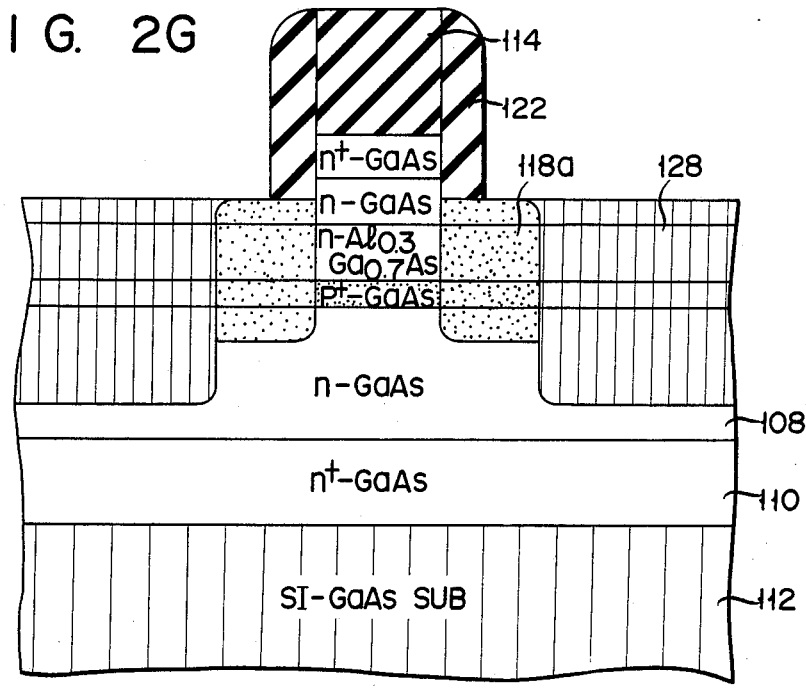

$SiO_2$ film 126 is removed by buffered hydrofluoric acid and $Si_3N_4$ film 124 is removed by $O_2 + CF_4$ plasma. Then, a structure as shown in FIG. 2G is obtained.

Figure 2H:
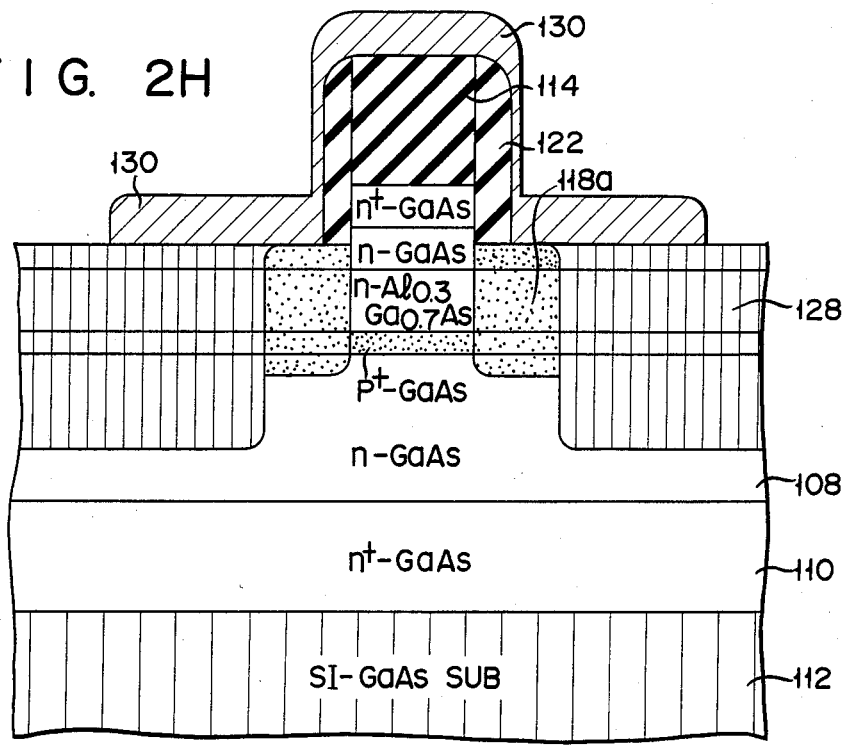

A base electrode pattern is formed on the wafer using a photoresist. When AuZn alloy 130 is deposited and lifted off using the resist, a structure as shown in FIG. 2H is obtained.

Figure 2I:
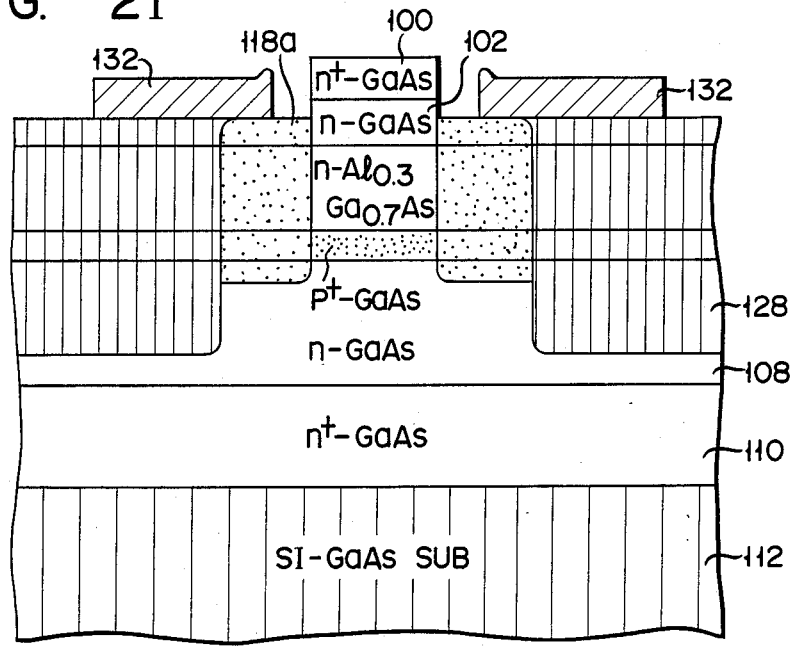

Thin AuZn alloy 130 deposited on the side wall of $SiO_2$ film 122 is etched using a mixture of iodine and potassium iodide to expose $SiO_2$ film 122. When films 122 and 114 are dissolved by buffered hydrofluoric acid, AuZn alloy 130 at the top of the emitter is lifted off and base electrode 132 is formed as shown in FIG. 2I.

Figure 2J:
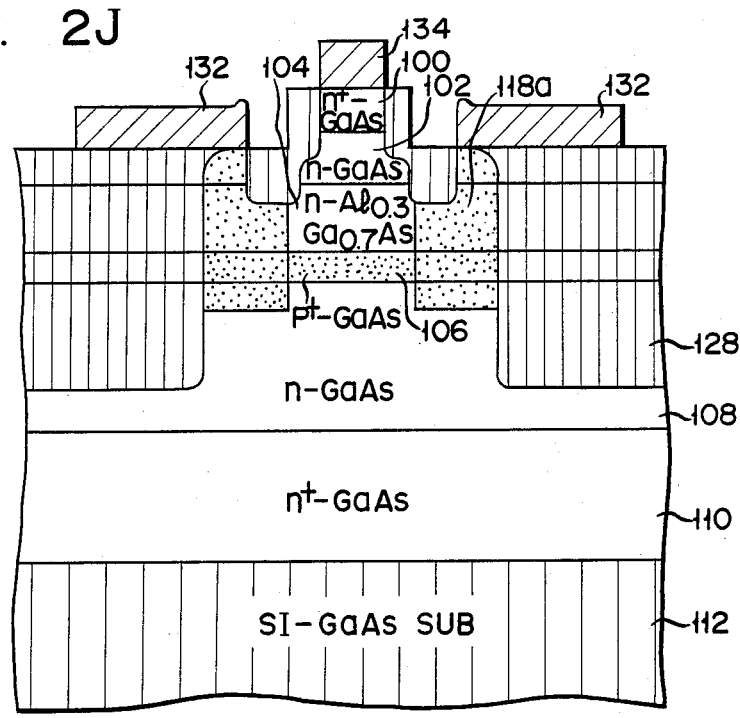

After emitter electrode 134 is formed, annealing is performed at 400° C. to allow emitter electrode 134 and GaAs layer 100 to react with each other and form an ohmic electrode. B ions are ion-implanted at an acceleration voltage of 40 keV to make the surface portions of layers 100, 102 and 104 become high-resistance layers. Thus, a heterojunction bipolar transistor as shown in FIG. 2J is completed.

In this embodiment, since element isolation and formation of a collector contact are not directly associated with the present invention, they are omitted from the description. However, element isolation can be performed by ion-implantation of B ions. As for the collector contact, $n^+$-type GaAs layer 100 is exposed by mesa etching to bring the AuGe alloy into contact with $n^+$-type GaAs layer 110.

According to this embodiment, the size of the external base region is only determined by the thickness of masks 122, 124 and 126 formed on the side wall of $SiO_2$ film 114. Therefore, as illustrated in the embodiment, the width of the external base region can easily be set to an order of submicrons. In addition, the base electrode is positioned with respect to the emitter by mask 122 formed on the side wall of $SiO_2$ film 114. In this embodiment, the parasitic capacitance between the base and the collector is significantly reduced, and the resultant heterojunction bipolar transistor can be operated at high speed.

Although GaAlAs/GaAs are used as semiconductor materials in the above embodiment, the semiconductor materials to be used herein are not limited thereto. InP/InGaAs and other materials can also be used.

A method of manufacturing a heterojunction bipolar transistor according to a second embodiment of the present invention will now be described with reference to FIGS. 3A to 3U.

Figure 3A:
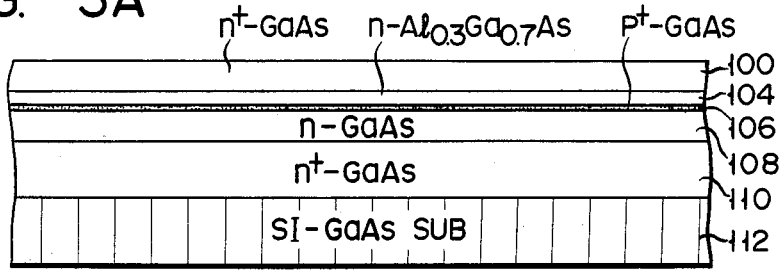
FIGS. 3A to 3U are sectional views of a semifinished product for explaining a method of manufacturing a heterojunction bipolar transistor according to a second embodiment of the present invention.

As shown in FIG. 3A, 0.9 μm thick n+-type GaAs layer 110 is epitaxially grown on semi-insulating GaAs substrate 112. 0.5 μm thick n-type GaAs layer 108 is epitaxially grown on layer 110. Layers 110 and 108 serve as the collectors. 0.1 μm thick p+-type GaAs layer 106 as a base is epitaxially grown on layer 108. 0.2 μm thick n-type $Al_{0.3}Ga_{0.7}As$ layer 105 and 0.5 μm thick n+-type GaAs layer 100 are sequentially formed on layer 106 by epitaxial growth to complete the wafer featured in this embodiment. Layers 100 and 104 serve as the emitter and layers 104 and 106 form a heterojunction therebetween.

Figure 3B:
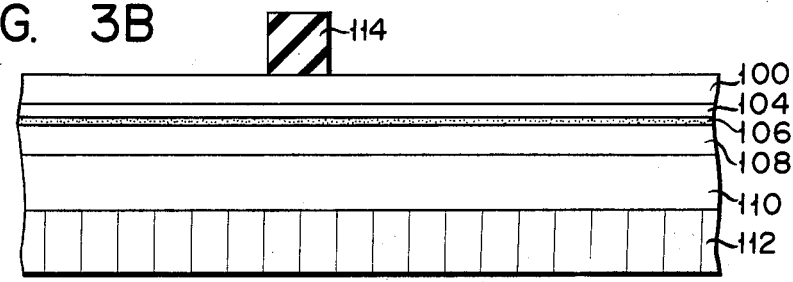

An $SiO_2$ film is deposited on the wafer to a thickness of 1.0 μm by CVD. An emitter region pattern is formed by a photoresist. Using the resist pattern, the $SiO_2$ film is etched by RIE using $CF_4$ gas as an etchant to form $SiO_2$ film 114. When the resist pattern is removed, a structure as shown in FIG. 3B is obtained. $SiO_2$ film 114 has a thickness large enough to block ions to be ion-implanted later.

Figure 3C:
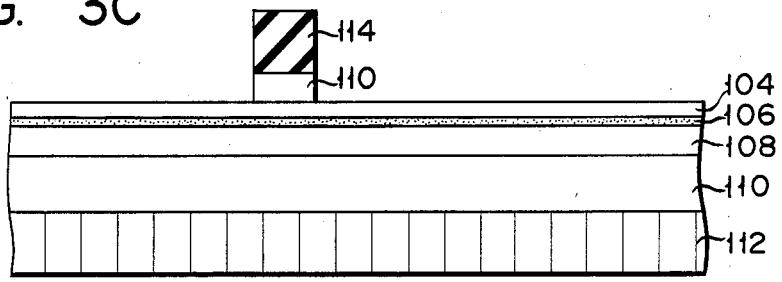

As shown in FIG. 3C, using $SiO_2$ film 114 as a mask, GaAs layer 100 is selectively etched by RIE using $CCl_2F_2$. Etching stops at a depth of layer 104.

Figure 3D:
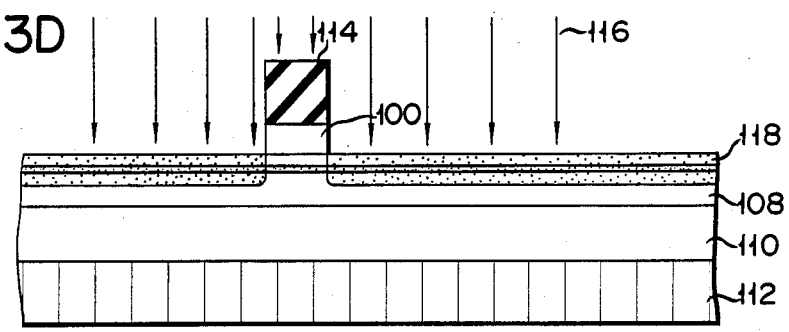

Thereafter, Mg ions are ion-implanted at a dose of $2 \times 10^{14}$ cm$^{-2}$ and an acceleration voltage of 200 keV to a depth of 0.6 μm. Mg ions reach layers 108. FIG. 3D shows this step and the resultant structure. Referring to FIG. 3D, arrows 116 indicate ion-implanted Mg ions. Due to the mask effect of $SiO_2$ film 114, Mg ions are ion-implanted only in the region etched by RIE to form Mg ion-implanted region 118. Region 118 serves as an external base region.

Figure 3E:
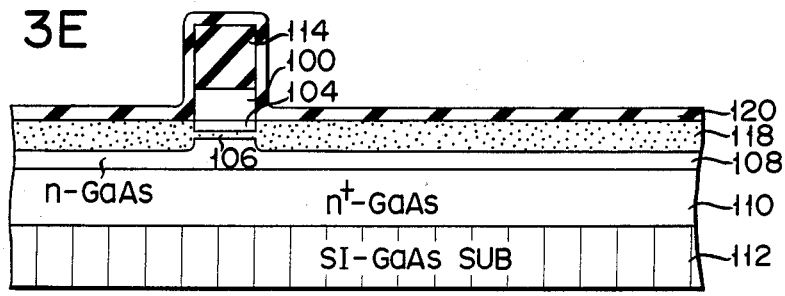

CVD $SiO_2$ film 120 is deposited on the wafer to a thickness of 0.2 μm, as shown in FIG. 3E. When annealing is performed at 800° C. using an infrared lamp, ion-implanted Mg ions are activated as acceptors and region 118 becomes p+-type conductive. $SiO_2$ film 120 functions as a mask formed on the side wall of $SiO_2$ film 114 and also as a protective film to prevent As dissociation upon annealing.

Figure 3F:
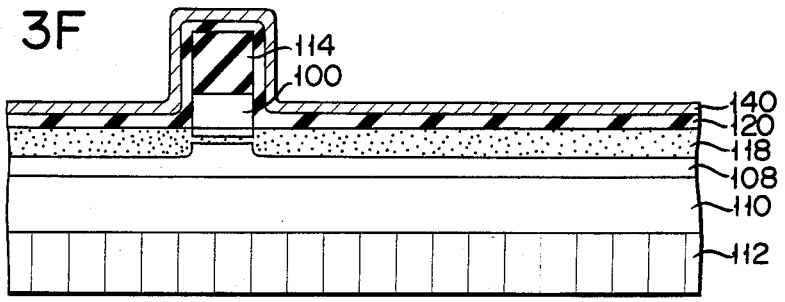

As shown in FIG. 3F, Al deposition film 140, which is 0.1 μm thick, is formed on the resultant structure.

Figure 3G:
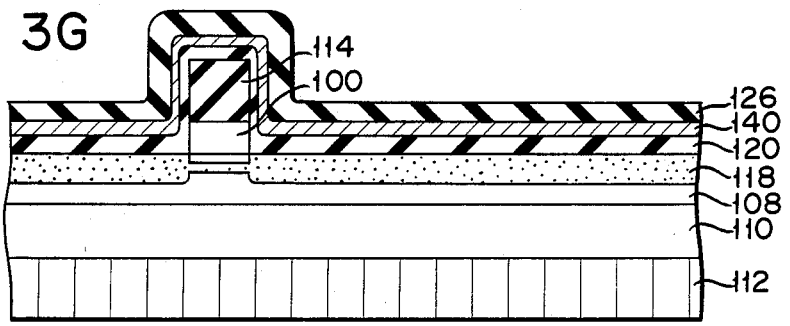

As shown in FIG. 3G, 0.5 μm thick CVD $SiO_2$ film 126 is formed on the resultant structure.

Figure 3H:
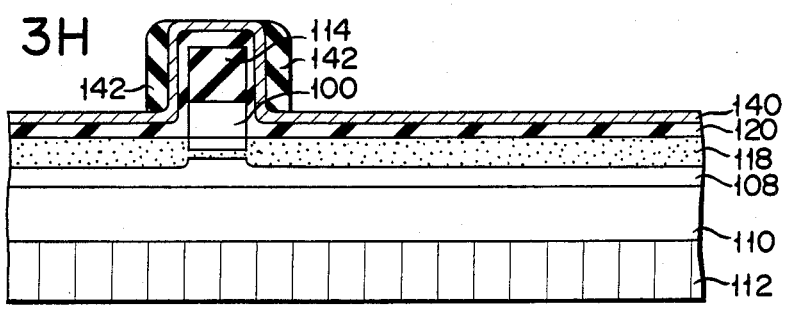

$SiO_2$ film 126 is etched by 0.5 μm by RIE using $CF_4$ gas, as shown in FIG. 3H. By RIE anisotropic etching, $SiO_2$ film 126 is left only on the side wall of Al deposition film 140 to obtain a structure as shown in FIG. 3H. Reference numerals 142 denotes the $SiO_2$ film remaining on the side wall.

Figure 3I:
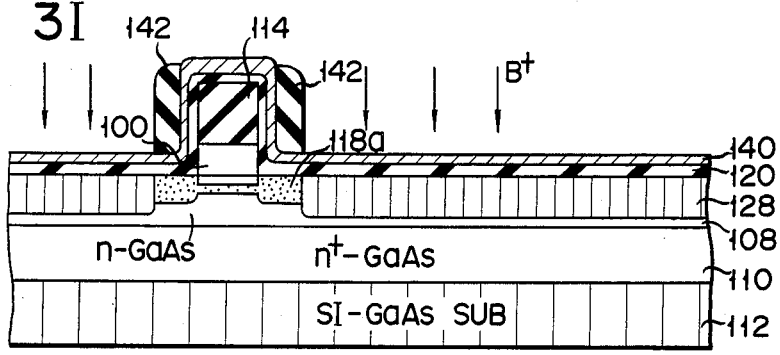

Subsequently, as shown in FIG. 3I, B ions are ion-implanted in the wafer at an acceleration voltage of 150 KeV and a dose of $1 \times 10^{13}$ cm$^{-2}$. B ions are implanted through a thin portion of the structure, i.e., $SiO_2$ film 120 and Al film 140 having a total thickness of 0.3 μm to become incident on the substrate. As a result, high-resistance layer 128 is formed. The Mg ion-implanted region not having high resistance becomes external base region 118a. The total thickness of $SiO_2$ film 126 and $Si_3N_4$ film 124 may be sufficient to define the width of external base region 118a.

Figure 3J:
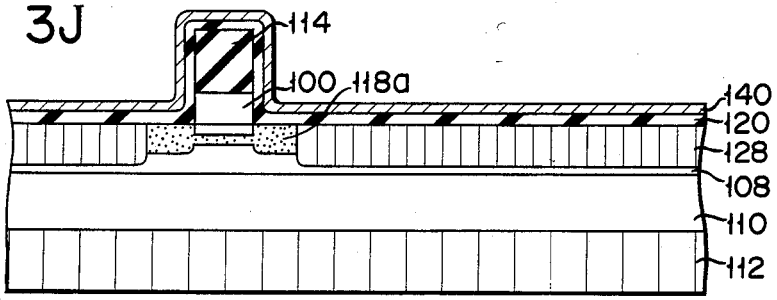

As shown in FIG. 3J, $SiO_2$ film 142 is etched by CDE (Chemical Dry Etching). Since Al film 140 is not etched in this etching step, $SiO_2$ film 120 thereunder remains unetched.

Figure 3K:
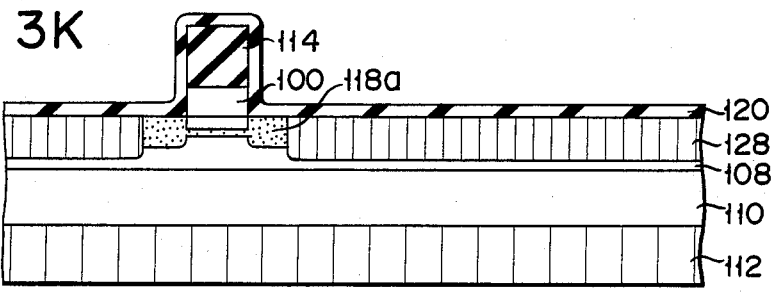

As shown in FIG. 3K, Al film 140 is removed by phosphoric acid.

Figure 3L:
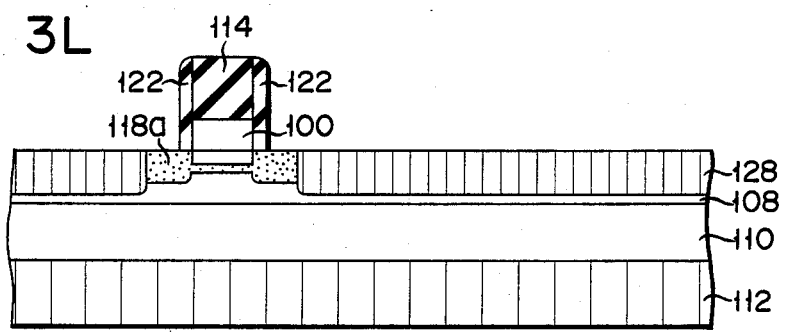

As shown in FIG. 3L, $SiO_2$ film 120 is etched by 0.2 μm by RIE using $CF_4$ gas. By RIE anisotropic etching, $SiO_2$ film 120 is left only on the side wall of mask material 114 to provide a structure as shown in FIG. 3L. Reference numeral 122 denotes an $SiO_2$ film remaining on the side wall.

Figure 3M:
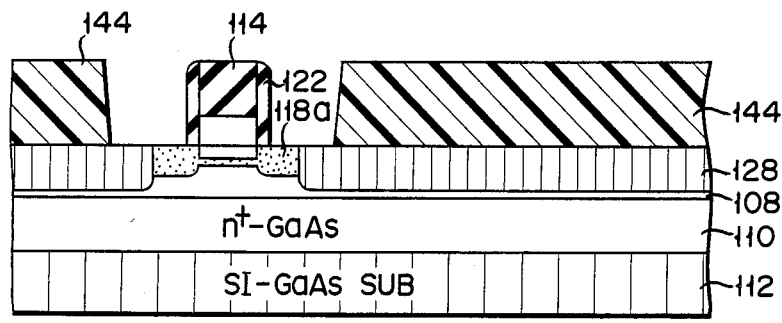

Thereafter, as shown in FIG. 3M, photoresist pattern 144 having an opening on the prospective base electrode region is formed.

Figure 3N:
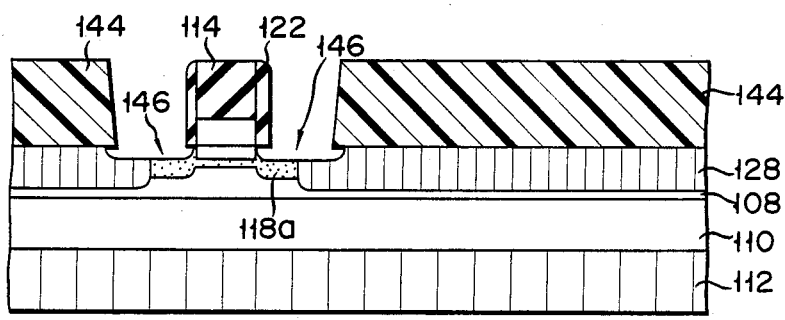

As shown in FIG. 3N, $Al_{0.3}Ga_{0.7}As$ layer 104 is etched using resist pattern 144 to form recess 146 extending from part of external base region 118a to part of high-resistance layer 128. P+-type GaAs layer 106 is exposed in the surface of recess 146. Since Al is diffused into layer 106 from overlying layer 104, it is best to slightly overetch layer 106 to remove the Al diffusion layer.

Figure 3O:
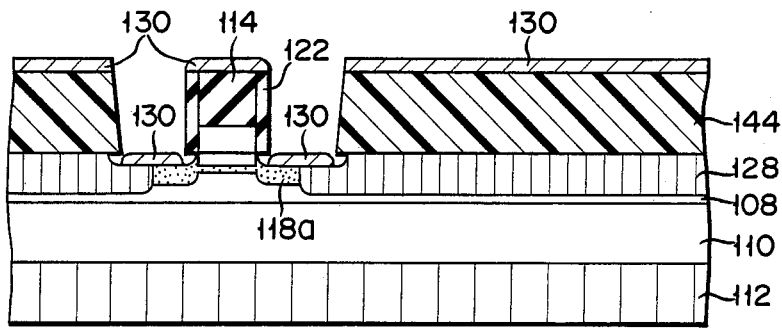

As shown in FIG. 3O, after layer 106 is exposed, AuZn alloy 103 is deposited while photoresist pattern 144 is left removed.

Figure 3P:
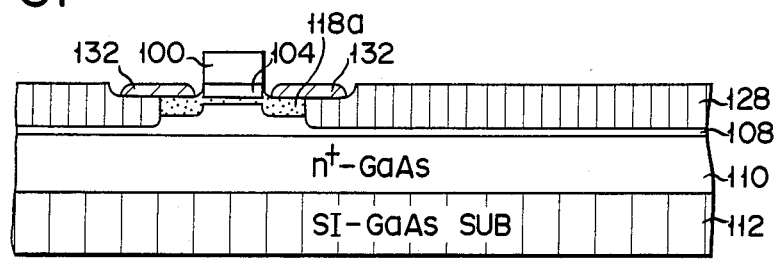

When photoresist 144 is dissolved by acetone and $SiO_2$ films 114 and 122 are dissolved by $NH_4F$ to achieve lift-off, the pattern of base electrode 132 is formed as shown in FIG. 3P.

Figure 3Q:
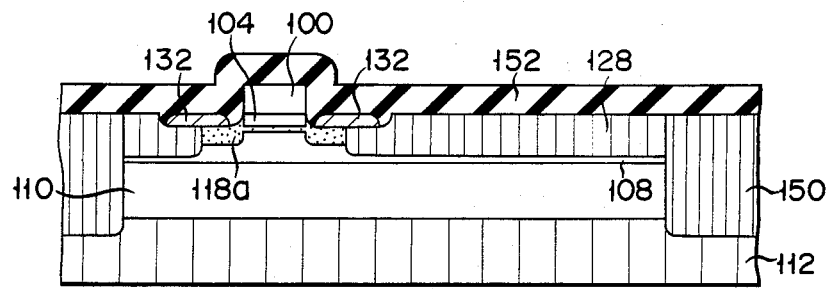

A photoresistor pattern (not shown) having an opening on the high-resistance layer for element isolation is formed. Proton ion-implantation is performed to form element isolation high-resistance layer 150. Thereafter, as shown in FIG. 3Q, 0.5 μm thick CVD $SiO_2$ film 152 is formed.

Figure 3R:
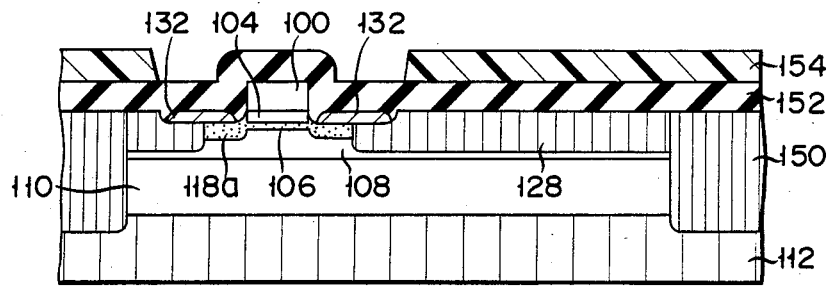

As shown in FIG. 3R, 0.5 μm thick resist pattern (positive type photo-resist) 154 is formed. This is performed to facilitate the following flattening step, and the resist on the emitter region is removed.

As shown in FIG. 3S, resist 156 is coated on the resultant structure to flatten the surface of the structure.

As shown in FIG. 3T, the resultant structure is etched back by RIE using $CF_4+O_2$ gas. By RIE using $CF_4+O_2$ gas, resist 156 and $SiO_2$ film 152 are etched at the same rate. Thus, only the top of layer 100 is exposed.

As shown in FIG. 3U, emitter electrode 134 is formed on layer 100. Layers 128, 150, 108 and 110 are etched to form contact hole 158 for connecting a collector electrode. Collector electrode 160 in contact with layer 110 and collector wiring 160 connected to electrode 160 are formed.

In this embodiment, in addition to the effects obtained in the first embodiment, the following effect is obtained. According to this embodiment, a heterojunction bipolar transistor is obtained in which the base electrode has low contact resistance. The p-n junction formed on the element surface is a homojunction formed by AlGaAs having a wide forbidden band gap. Therefore, wasteful current not contributing to the operation of the intrinsic transistor does not flow to this homojunction, producing a high current amplification factor. In addition to the above, since the opening of the emitter electrode is formed in self-alignment with the emitter, the area of the emitter region can be reduced in comparison to the first embodiment.

What is claimed is:

1. A method of manufacturing a heterojunction bipolar transistor comprising the steps of:
    (a1) forming a first semiconductor layer of a first conductivity type as a collector on a semiconductor substrate;

(a2) forming a second semiconductor layer of a second conductivity type as a base on said first semiconductor layer;

(a3) forming a third semiconductor layer of the first conductivity type as an emitter on said second semiconductor layer, said third and second semiconductor layers constituting a heterojunction;

(a4) selectively forming a first mask on said third semiconductor layer;

(a5) ion-implanting ions of an impurity of the second conductivity type into the resultant structure using a first mask, thereby forming an emitter region and an external base region of the second conductivity type extending to said second semiconductor layer;

(a6) forming a second mask on a side wall of said first mask; and (a7) ion-implanting a predetermined first material into the resultant structure using said first and second masks, thereby forming a high-resistance layer for isolating said external base region, wherein a width of a remaining external base region is defined by a width of said second mask.

2. The method according to claim 1, wherein said first mask is thick enough to block ions implanted in step (a5).

3. The method according to claim 1, wherein said second mask is thick enough to define a predetermined width of said remaining external base region, thereby reducing parasitic capacitance between said remaining external base region and said collector.

4. The method according to claim 1, further comprising the steps of:

(a8) etching the side wall of the second mask so as to leave a third mask thinner than the second mask on the side wall of the first mask;

(a9) forming a layer of a conductive material on the resultant structure; and (a10) removing the first and third masks so as to lift-off extra conductive material, thereby forming a base electrode in contact with the remaining external base region, wherein a gap between said base electrode and said emitter region is defined by a width of said third mask.

5. The method according to claim 2, wherein said first mask is an $SiO_2$ layer.

6. The method according to claim 3, wherein said second mask is an $SiO_2$ layer.

7. The method according to claim 3, wherein said second mask consists of an $SiO_2$ layer and an $Si_3N_4$ layer.

8. The method according to claim 3, wherein said second mask consists of an $SiO_2$ layer and an Al layer.

9. The method according to claim 4, wherein said third mask is an $SiO_2$ layer.

10. The method according to claim 4, wherein before step (a9), a fourth mask is selectively formed, and part of the remaining external base region is etched so as to expose the second semiconductor layer.

11. The method according to claim 9, further comprising the steps of:

(a11) selectively doping a predetermined second material to form an element isolation region; and (a12) forming an emitter electrode in contact with said emitter region and a collector electrode in contact with said collector.

* * * * *